United States Patent
Zhang

(10) Patent No.: US 11,282,885 B2
(45) Date of Patent: Mar. 22, 2022

(54) WAFER STRUCTURE AND CHIP STRUCTURE HAVING THROUGH-HOLE ELECTRICAL CONNECTION FOR BONDED CHIPS

(71) Applicant: Wuhan Xinxin Semiconductor Manufacturing Co., Ltd., Hubei (CN)

(72) Inventor: Guomin Zhang, Hubei (CN)

(73) Assignee: Wuhan Xinxin Semiconductor Manufacturing Co., Ltd., Wuhan (CN)

( * ) Notice: Subject to any disclaimer, the term of this patent is extended or adjusted under 35 U.S.C. 154(b) by 94 days.

(21) Appl. No.: 16/581,093

(22) Filed: Sep. 24, 2019

(65) Prior Publication Data

US 2021/0028218 A1    Jan. 28, 2021

(30) Foreign Application Priority Data

Jul. 24, 2019    (CN) .......................... 201910672977.0

(51) Int. Cl.
*H01L 27/146*    (2006.01)

(52) U.S. Cl.
CPC .. *H01L 27/14636* (2013.01); *H01L 27/14623* (2013.01); *H01L 27/14629* (2013.01);
(Continued)

(58) Field of Classification Search
CPC ......... H01L 27/14636; H01L 27/14623; H01L 27/14629; H01L 27/14632;
(Continued)

(56) References Cited

U.S. PATENT DOCUMENTS 8,405,182 B2    3/2013    Chou et al.
9,349,767 B2    5/2016    Borthakur et al.
(Continued)

FOREIGN PATENT DOCUMENTS

CN    102769021 A    11/2012
CN    104576662 A    4/2015
(Continued)

OTHER PUBLICATIONS

First Chinese Office Action regarding Application No. 201910672977.0 dated Feb. 9, 2021. English translation provided by Unitalen Attorneys at Law.

*Primary Examiner* — Lex H Malsawma
(74) *Attorney, Agent, or Firm* — Harness, Dickey & Pierce, P.L.C.

(57) ABSTRACT

A wafer structure, a method for manufacturing the wafer structure, and a chip structure. A front surface of a first chip provided with a photosensitive array is bonded to a front surface of a second chip provided with a logic device. An electrical-connection through-hole is provided on a back surface of the first chip at a pad region. The electrical-connection through-hole runs from the back surface of the first chip, via a top wiring layer in the first chip, to a top wiring layer in the second chip. A pad is provided on the electrical-connection through-hole. Hence, integration of a photosensitive device of a stacked type is achieved. There are advantages of a high integration degree and a simple structure. Transmission efficiency of a device is effectively improved, and complexity of a manufacturing process is reduced.

13 Claims, 10 Drawing Sheets

(52) U.S. Cl.
CPC .. *H01L 27/14632* (2013.01); *H01L 27/14643* (2013.01); *H01L 27/14685* (2013.01); *H01L 27/14687* (2013.01); *H01L 27/14689* (2013.01)

(58) Field of Classification Search
CPC ......... H01L 27/14643; H01L 27/14685; H01L 27/14687; H01L 27/14689
See application file for complete search history.

(56) References Cited

U.S. PATENT DOCUMENTS

| | | | |
|---|---|---|---|
| 9,691,811 B1* | 6/2017 | Borthakur | H01L 23/3171 |
| 9,728,572 B2* | 8/2017 | Park | H01L 27/1469 |
| 9,806,120 B2* | 10/2017 | Sano | H01L 27/14641 |
| 2011/0233702 A1* | 9/2011 | Takahashi | H01L 27/14636 257/432 |
| 2012/0280348 A1 | 11/2012 | Chou et al. | |
| 2013/0181317 A1* | 7/2013 | Wakiyama | H01L 21/76898 257/459 |
| 2015/0303233 A1 | 10/2015 | Borthakur et al. | |
| 2016/0056196 A1* | 2/2016 | Li | H01L 27/14634 257/432 |
| 2016/0064438 A1* | 3/2016 | Huang | H01L 27/14636 257/432 |
| 2016/0111463 A1 | 4/2016 | Borthakur et al. | |
| 2019/0140133 A1* | 5/2019 | Chen | H01L 31/028 |

FOREIGN PATENT DOCUMENTS

| | | |
|---|---|---|
| CN | 104616997 A | 5/2015 |
| CN | 204516768 U | 7/2015 |
| CN | 106783901 A | 5/2017 |

\* cited by examiner

WAFER STRUCTURE AND CHIP STRUCTURE HAVING THROUGH-HOLE ELECTRICAL CONNECTION FOR BONDED CHIPS

The present disclosure claims the priority to Chinese Patent Application No. 201910672977.0, titled "WAFER STRUCTURE, METHOD FOR MANUFACTURING THE SAME, AND CHIP STRUCTURE", filed on Jul. 24, 2019 with the China National Intellectual Property Administration, the content of which is incorporated herein by reference.

FIELD

The present disclosure relates to the field of semiconductor device and manufacture thereof, and particularly, to a wafer structure, a method for manufacturing the wafer structure, and a chip structure.

BACKGROUND

With the continuous development of semiconductor technology, CMOS image sensors (complementary metal-oxide-semiconductor image sensor, CIS) develop rapidly. A stack CIS is a high-end product at present. The stack CIS is manufactured by stacking and bonding an image sensor chip with an image signal processor chip through bonding technology. The stack CIS are advantageous due to high performance and a high degree of integration. The stack CIS are subject to problems such as a complex process and a high cost in manufacture.

SUMMARY

In view of the above, an objective of the present disclosure is to provide a wafer structure, a method for manufacturing the wafer structure, and a chip structure. A level of integration is high, a structure is simple, and complexity of a manufacturing process is reduced.

Following technical solutions are provided according to embodiments of the present disclosure, so as to achieve the above objective.

A chip structure is provided, including a first chip and a second chip that are stacked, a first insulating layer, a first electrical-connection through-hole, and a pad. A front surface of the first chip faces a front surface of the second chip. A bonding layer is provided between the front surface of the first chip and the front surface of the second chip. The first chip includes a photosensitive array region, a peripheral circuit region and a pad region. A first interconnection layer is formed on the front surface of the first chip at the pad region and the peripheral circuit region. The second chip includes a logic device, and a second interconnection layer connected with the logic device. The first insulating layer covers a back surface of the first chip at the pad region. The first electrical-connection through-hole is located at the pad region. The first electrical-connection through-hole runs from the first insulating layer, via a top wiring layer in the first interconnection layer at the pad region, to a top wiring layer in the second interconnection layer. The pad is located on the first electrical-connection through-hole.

The chip structure further includes a second insulating layer and a reflective grating. The second insulating layer covers the back surface of the first chip at the photosensitive array region. The reflective grating is located in the second insulating layer at the photosensitive array region. The reflective grating is arranged in correspondence to a peripheral region of a photosensitive unit. A fillable opening is provided among the reflective grating. A part of the second insulating layer is located under the fillable opening and the reflective grating.

The chip structure further includes a shielding layer. The second insulating layer further covers the back surface of the first chip at the peripheral circuit region. The shielding layer is located in the second insulating layer at the peripheral circuit region. Another part of the second insulating layer are located under the shielding layer.

The second insulating layer and the first insulating layer are identical in structure and in composition.

The reflective grating, the shielding layer, and the first electrical-connection through-hole include a same metal material.

The chip structure further includes a third insulating layer. The third insulating layer is located above the first insulating layer and the second insulating layer. The third insulating layer covers the shielding layer and the reflective grating. A part of the pad is located on the third insulating layer at the pad region.

The chip structure further includes a second electrical-connection through-hole located at the peripheral circuit region. The second electrical-connection through-hole runs from the first insulating layer, via a top wiring layer in the first interconnection layer at the peripheral circuit region, to the top wiring layer in the second interconnection layer.

A wafer structure is provided, including a wafer bonding structure. The wafer bonding structure includes an array of any one of the aforementioned chip structures.

A method for manufacturing a wafer structure is provided, including: providing a bonded wafer, where the bonded wafer includes a first wafer and a second wafer that are stacked, a front surface of the first wafer faces a front surface of the second wafer, a bonding layer is provided between the front surface of the first wafer and the front surface of the second wafer, the first wafer includes first chips arranged in an array, each of the first chips includes a photosensitive array region, a peripheral circuit region and a pad region, a first interconnection layer is arranged on the front surface of the first wafer at the pad region and at the peripheral circuit region, the second wafer includes second chips arranged in an array, and each of the second chips includes a logic device and a second interconnection layer connected with the logic device; forming a first insulating layer on a back surface of the first wafer at the pad region; forming a first electrical-connection through-hole at the pad region, where the first electrical-connection through-hole runs from the first insulating layer, via a top wiring layer in the first interconnection layer at the pad region, to a top wiring layer in the second interconnection layer; and forming a pad on the first electrical-connection through-hole.

The first insulating layer is further formed on the back surface of the first wafer at a region out of the pad region. Forming the first electrical-connection through-hole at the pad region includes: forming a first through-hole running from the first insulating layer, via the top wiring layer in the first interconnection layer, to the top wiring layer in the second interconnection layer; and filling the first through-hole to form the first electrical-connection through-hole. The method for manufacturing the wafer structure further includes: forming a to-be-filled opening in the first insulating layer at the region out of the pad region, where a depth of the to-be-filled opening is smaller than a thickness of the first insulting layer, and the to-be-filled opening includes one or both of a grating opening located at the photosensitive array region and a shielding opening located at the peripheral circuit region; filling the to-be-filled opening to form a filled opening, where the filled opening includes one or both of a reflective grating formed by filling the grating opening and a shielding layer formed by filling the shielding opening; and forming a third insulating layer above the filled opening.

Forming the third insulating layer above the filled opening includes: forming the third insulating layer that covers the back surface of the first wafer; and removing the third insulating layer that is above the first electrical-connection through-hole, before forming the pad on the first electrical-connection through-hole.

The to-be-filled opening includes the grating opening. The method for manufacturing the wafer structure further includes: forming a fillable opening among the reflective grating, where the fillable opening runs from the third insulating layer, and the second insulating layer remains at a bottom and a sidewall of the fillable opening.

The method for manufacturing the wafer structure further includes: cutting the bonding wafer, to obtain an independent chip structure.

The wafer structure, the method for manufacturing the wafer structure, and the chip structure are provided according to embodiments of the present disclosure. The front surface of the first chip provided with the photosensitive array is bonded to the front surface of the second chip provided with the logic device. An electrical-connection through-hole is provided on the back surface of the first chip at the pad region. The electrical-connection through-hole runs from the back surface of the first chip, via the top wiring layer in the first chip, to the top wiring layer in the second chip. The pad is provided on the electrical-connection through-hole. Hence, integration of a photosensitive device of a stacked type is achieved. There are advantages of a high integration degree and a simple structure. Transmission efficiency of a device is effectively improved, and complexity of a manufacturing process is reduced.

BRIEF DESCRIPTION OF THE DRAWINGS

For clearer illustration of the technical solutions according to embodiments of the present disclosure or conventional techniques, hereinafter are briefly described the drawings to be applied in embodiments of the present disclosure or conventional techniques.

Apparently, the drawings in the following descriptions are only some embodiments of the present disclosure, and other drawings may be obtained by those skilled in the art based on the provided drawings without creative efforts.

DETAILED DESCRIPTION

For better understanding of the above objects, features and advantages of the present disclosure, hereinafter specific embodiments of the present disclosure are described in detail in conjunction with the drawings.

Many specific details are illustrated in following description to facilitate a full understanding of the present disclosure. The present disclosure may be practiced in another manner besides those described herein. Those skilled in the art can analogize without departing from the scope of the present disclosure. Therefore, the present disclosure is not limited to specific embodiments disclosed hereinafter.

The present disclosure is described in detail in conjunction with the drawings. To facilitate description in describing embodiments of the present disclosure in detail, a sectional view showing a structure of a device is not partially enlarged on a general scale. The schematic diagram is merely exemplary, and the protection scope of present disclosure should not be limited thereto. In addition, the three-dimensional spatial dimensions of length, width and depth should be included in practical manufacture.

Figure 1:
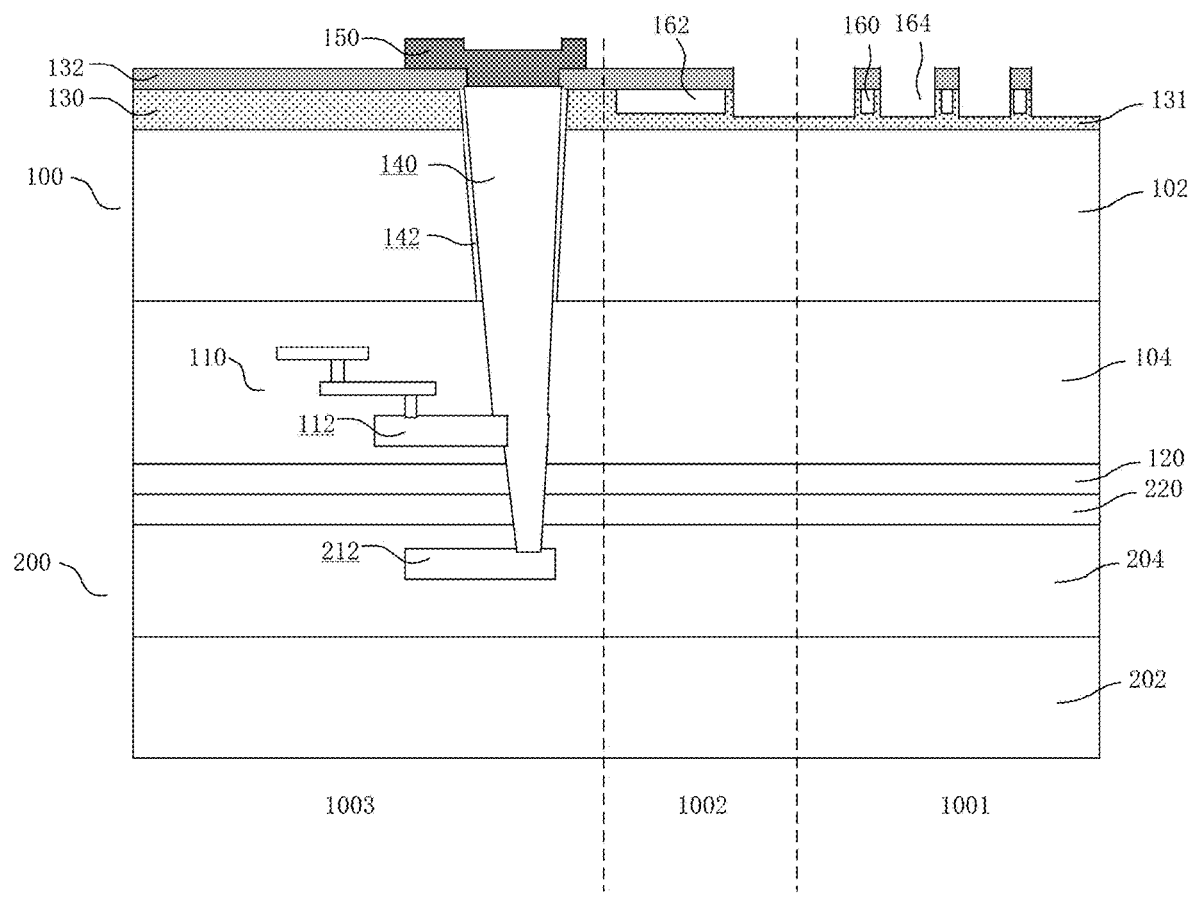
FIG. 1 is a schematic structural diagram of a cross section of a chip structure according to an embodiment of the present disclosure.

Referring to FIG. 1, a chip structure is provided according to an embodiment of the present disclosure. The chip structure includes: a first chip 100 and a second chip 200 that are stacked, a first insulating layer 130, a first electrical-connection through-hole 140, and a pad 150.

A front surface of the first chip 100 faces a front surface of the second chip 200. A bonding layer 120/220 is provided between the front surface of the first chip 100 and the front surface of the second chip 200. The first chip 100 includes a photosensitive array region 1001, a peripheral circuit region 1002 and a pad region 1003. A first interconnection layer 110 is formed on the front surface of the first chip 100 at the pad region 1003 and the peripheral circuit region 1002. The second chip 200 includes a logic device, and a second interconnection layer connected with the logic device.

The first insulating layer 130 covers a back surface at the pad region 1003.

The first electrical-connection through-hole 140 runs from the first insulating layer 130, via a top wiring layer 112 in the first interconnection layer 110, to a top wiring layer 212 in the second interconnection layer.

The pad 150 is located on the first electrical-connection through-hole 140.

Devices and an interconnection layer electrically connecting the devices have been formed on both the first chip 100 and the second chip 200. The devices may be formed on a substrate. In embodiments of the present disclosure, two opposite surfaces of a chip are described as a front surface of the chip and a back surface of the chip, respectively, for convenience in description. The front surface of the chip is a surface that is provided with the devices and the interconnection layer, and is also referred to as a front surface of the substrate. The back surface of the chip is an opposite surface of the front surface, and is also referred to as a back surface of the substrate.

In one embodiment, the first chip 100 is for forming photosensitive sensor units. The first chip 100 includes the photosensitive array region 1001, the peripheral circuit region 1002 and the pad region 1003. The photosensitive array region 1001 is provided with the photosensitive units arranged in an array. The photosensitive unit is a photosensitive device. In one embodiment, the photosensitive device includes a photodiode. A photosensitive unit may include four CMOS devices and a photodiode. The peripheral circuit region 1002 is for forming a peripheral control circuit for the photosensitive array. The peripheral control circuit may include a logic device and an interconnection layer. The first interconnection layer 110 for electrically connection among the photosensitive units is formed at the peripheral circuit region 1002 and the pad region 1003. A pad for introducing an electrical signal is formed at the pad region 1003. In one embodiment, the photosensitive array region 1001 may be located in middle of the first chip, the peripheral circuit region 1002 may be located at a region surrounding the photosensitive array region 1001, and the pad region 1003 may be located at a region surrounding the peripheral circuit region 1002.

The second chip 200 for forming the logic circuit. The logic circuit includes the logic device, and the second interconnection layer connected with the logic device. The logic circuit may be formed by the logic device. The logic device may include a CMOS device. The CMOS device may include a PMOS and/or a NMOS. The logic circuit may be an image signal processor (ISP) configured to processing an image signal obtained by the first chip.

In one embodiment, the first chip 100 may include a first substrate 102, the photosensitive array, a peripheral circuit and the first interconnection layer 110. The photosensitive array, the peripheral circuit and the first interconnection layer 110 are formed on a front surface of the first substrate 102, and are covered by a first covering layer 104 made of a dielectric material. The second chip 200 may include a second substrate 202, the logic device, and the second interconnection layer connected with the logic device. The logic device and the second interconnection layer are formed on a front surface of the second substrate 202, and are covered by a second covering layer 204 made of a dielectric material.

The first covering layer 104 or the second covering layer 204 may be a stacked structure, which may include an interlayer dielectric layer, an intermetallic dielectric layer, or the like. The first interconnection layer 110 is formed in the first covering layer 104, and the second interconnection layer is formed in the second covering layer 204. Both the first covering layer 104 and the second interconnection layer are for interconnection between devices. The first interconnection layer 110 or the second interconnection layer may include a contact plug, a via hole and a wiring layer. The wiring layer may include one or more layers. The interconnection layer may be made of a metal material, such as tungsten, aluminum, or copper. In one embodiment, the last-formed wiring layer in the first interconnection layer 110 is referred to as a top wiring layer 112 of the first interconnection layer, and the last-formed wiring layers in the second interconnection layer is referred to as a top wiring layer 212 of the second interconnection layer. The first substrate 102 or the second substrate 202 may be a semiconductor substrate, such as a Si substrate, a Ge substrate, a SiGe substrate, a silicon-on-insulator (SOI) substrate, or a germanium-on-insulator (GOI) substrate.

It should be noted that, as schematic diagrams, the drawings corresponding to embodiments of the present disclosure do not show every specific device structure in each chip. For example, only the top wring layer is shown in the interconnection layer of the second chip.

A first bonding layer 120 and a second bonding layer 220 are formed on the front surface of the first chip 100 and the front surface of the second chip 200, respectively. The first chip 100 and the second chip 200 are bonded together via such two bonding layers. A bonding layer after the bonding is formed from the first bonding layer 120 and the second bonding layer 220. The first bonding layer 120 and the second bonding layer 220 may be made of a bonding dielectric material, and may be a single layer or a stacked structure. The first bonding layer 120 and the second bonding layer 220 may be made of a same material or different materials. For example, the first bonding layer 120 and the second bonding layer 220 may be made of one or more bonding dielectric materials, such as silicon oxide, silicon nitride, or nitrogen doped silicon carbide (NDC). In one embodiment, both the first bonding layer 120 and the second bonding layer 220 may be made of silicon oxide.

A first insulating layer 130 is formed on a back surface of the first chip 100 at the pad region 1003. A material of the first insulating layer 130 may be a single layer or a stacked structure. The material of the first insulating layer may be one or a combination of silicon oxide, silicon nitride, and a high-k dielectric material. The high-k dielectric material is a dielectric material with a higher dielectric constant than silicon oxide. The high-k dielectric material may be a hafnium-based oxide, such as $HfO_2$, HfSiO, HfSiON, HfTaO, HfTiO, $ZrO_2$, $Al_2O_3$, $La_2O_3$. In one embodiment, the first insulating layer 130 includes a high-k dielectric layer, and a silicon oxide layer located on the high-k dielectric layer.

A first electrical-connection through-hole 140 is arranged at the back surface of the first chip 100. The first electrical-connection through-hole 140 is located at the pad region 1003, and is configured to connect and lead out interconnection layers in the first chip and in the second chip. The first electrical-connection through-hole 140 is a through-hole running through the first substrate. The first electrical-connection through-hole 140 runs from the first insulating layer, via the top wiring layer 112 of the first interconnection layer, to the top wiring layer 212 of the second interconnection layer. The first electrical-connection through-hole 140 contacts and connects with both the top wiring layer 112 of the first interconnection layer and the top wiring layer 212 of the second interconnection layer. Thereby the interconnection layers of the first chip 100 and the second chip 200 are interconnected and led out from the back surface of the first chip 100. Further, a pad 150 may be formed on the first electrical-connection through-hole 140, such that interconnection between the two chips are led out. A material of the first electrical-connection through-hole 140 may be a conductive material, such as tungsten or copper. An insulating material is arranged between a side wall of the first electrical-connection through-hole 140 and the first substrate 102, so as to achieve insulating isolation between the through-hole 140 and the first substrate 102. The insulating material may be one or a combination of silicon oxide, silicon nitride, or silicon oxynitride.

In one embodiment, the top wiring layer 112 of the first interconnection layer and the top wiring layer 212 of the second interconnection layer may be arranged in a staggered manner along a vertical direction. The first electrical-connection through-hole 140 may include an upper portion and a lower portion with different diameters. The upper portion extends from the first insulating layer 130 to the top wiring layer 112 of the first interconnection layer. The lower portion further extends to a surface of the top wiring layer 212 of the second interconnection layer.

The pad 150 is arranged on the first electrical-connection through-hole 140. The pad 150 contacts and connects with the first electrical-connection through-hole 140. The first interconnection layer and the second interconnection layer are interconnected and led out via the pad 150. A material of the pad 150 is conductive, and may be aluminum in one embodiment.

On the back surface of the first chip 100, a reflective grating 160 and a shielding layer 162 may be arranged at the photosensitive array region 1001 and the peripheral circuit region 1002, respectively. The reflective grating 160 includes crisscrossing reflective stripes. The reflective grating 160 is formed on the back surface of the first substrate 102, and corresponds a peripheral region of a photosensitive unit. That is, regions surrounded by the reflective stripes correspond to regions at which the photosensitive units are located, and the periphery region of the photosensitive unit corresponds to the reflective stripes. Thus, light crosstalk between adjacent photosensitive units can be prevented, eventually improving sharpness of a picture captured by the chip. The shielding layer 162 isolates a photoelectric signal at the peripheral circuit region, so as to protect a CMOS device on the substrate 102 at the peripheral circuit region from light irradiation. It is appreciated that extra light irradiation generates an extra leakage current, thereby affecting a performance of the chip.

In one embodiment, the reflective grating 160 and the shielding layer 162 may be made of metal, and may be arranged in a second insulting layer 131. The second insulating layer 162 covers the back surface of the first chip 100 at the photosensitive array region 1001. The reflective grating 160 is arranged within a partial thickness of the second insulating layer 131 at the photosensitive array region 1001, and does not run through the second insulating layer 131. The reflective grating 160 and the first substrate 102 are isolated by the second insulating layer 131. A fillable opening 164 may be provided in the second insulating layer 131. The fillable opening 164 is located among reflective grating, and does not run through the second insulating layer 131. A buried color filter (BCF) may be filled into the fillable opening 164. The second insulating layer 131 may be a single layer or a stacked structure, and may be same as the first insulating layer in material and structure.

The second insulating layer 131 may further cover the back surface of the first chip at the peripheral circuit region 1002. The shielding layer 162 is located in the second insulating layer 131 at the peripheral circuit region 1002. The shielding layer 162 does not run through the second insulating layer 131, and is insulated from the first substrate 102 by the second insulating layer 131.

In one embodiment, the shielding layer 162 and the reflective grating 160 may be same as the first electrical-connection through-hole 140 in material. For example, the material may be copper. The first insulating layer 130 and the second insulating layer 131 may be simultaneously formed, and may be an identical layer. Namely, the first insulating layer 130 and the second insulating layer 131 may be same in structure and composition.

The shielding layer 162, the reflective grating 160 and the first insulating layer 130 may be covered by a third insulating layer 132. The third insulating layer 132 covers an upper surface of the shielding layer 162 and the reflective grating 160. The third insulating layer 132 extends to the pad region 1003, and an opening is provided in the third insulating layer 132 above the first electrical-connection through-hole 140. The opening is configured to form the pad 150. The pad 150 may extend from the opening to cover a part of the third insulating layer at the pad region.

A second electrical-connection through-hole (not shown in the figure) may further be arranged at the peripheral circuit region 1002. The second electrical-connection through-hole runs from the first insulating layer, via a top wiring layer of the first interconnection layer at the peripheral circuit region, and to the top wiring layer of the second interconnection layer. The second electrical-connection through-hole may be same as the first electrical-connection through-hole in structure. The second electrical-connection through-hole is configured to electrically connect the interconnection layers in the first chip and the second chip, and not configured to lead out the interconnection layers.

Figure 2:
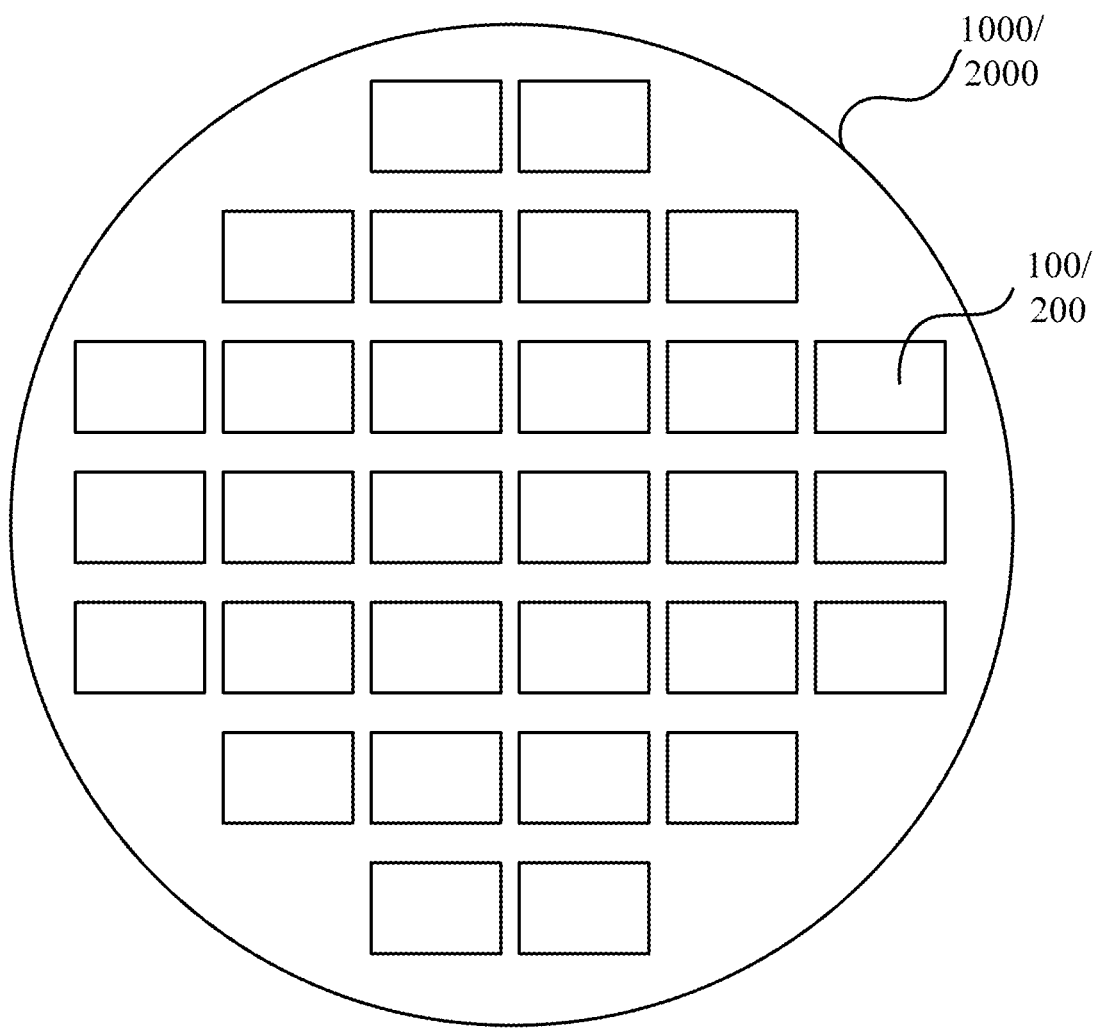
FIG. 2 is a top view of a wafer in a wafer structure according to an embodiment of the present disclosure.

Hereinabove the chip structure is described in detail according to embodiments of the present disclosure. A wafer structure further is provided according to an embodiment of the present disclosure. The wafer structure includes a wafer bonding structure. The wafer bonding structure includes an array of the aforementioned chip structures. Reference is made to FIGS. 1 and 2. FIG. 2 is a top view of a wafer in a wafer structure according to an embodiment of the present disclosure. Each wafer 1000/2000 is provided with chips 100/200 that are arranged in an array. Cutting trenches are formed among the chips. The wafer bonding structure is generated after the wafers 1000/2000 are bonded. The chip structures in the wafer bonding structure are arranged in an array.

A method for manufacturing a wafer structure and a chip structure is further provided according to an embodiment of the present disclosure. The method includes steps S01 to S04.

Figure 3:
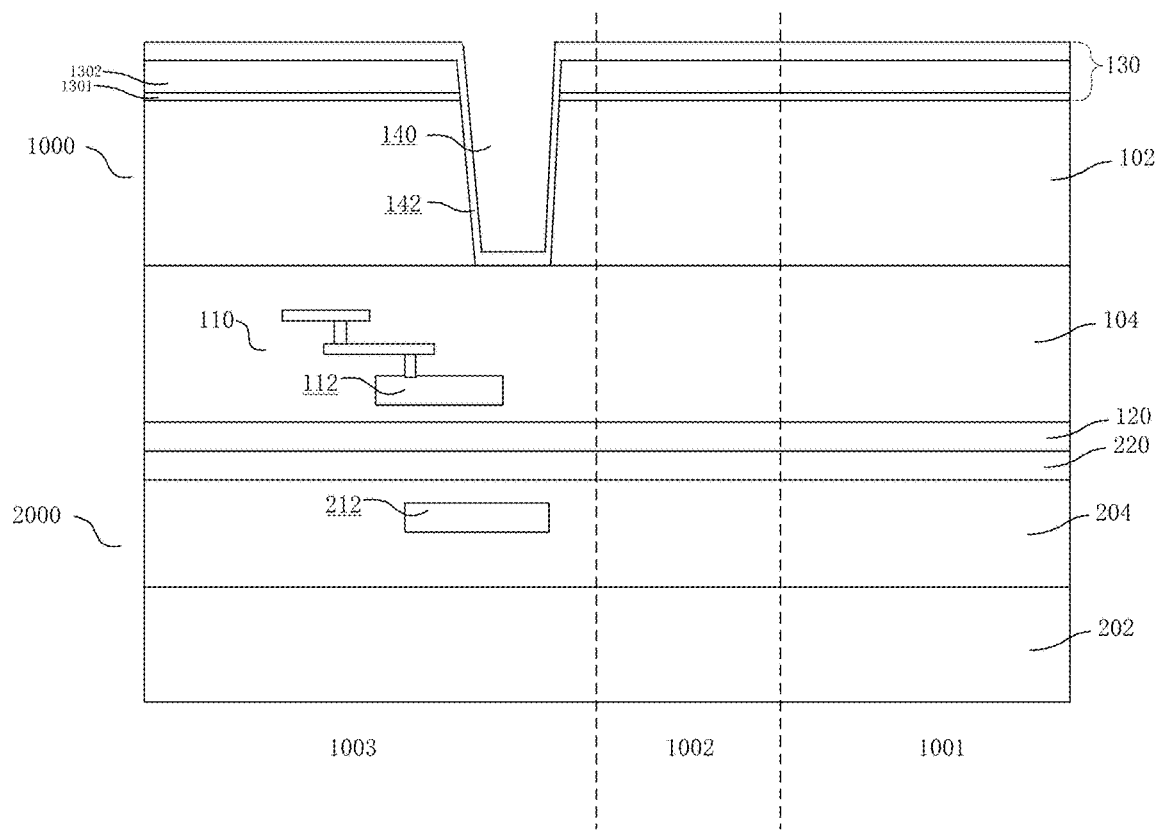
FIGS. 3 to 10 are schematic structural diagrams of a cross section of a wafer structure formed in a method for manufacturing the wafer structure according to an embodiment of the present disclosure.

In step S01, a bonded wafer is provided. The bonded wafer includes a first wafer 1000 and a second wafer 2000 that are stacked. A front surface of the first wafer 1000 faces a front surface of the second wafer 2000. A bonding layer 120 and 220 is provided between the front surface of the first wafer 1000 and the front surface of the second wafer 2000. The first wafer 1000 includes first chips arranged in an array. The first chip includes a photosensitive array region 1001, a peripheral circuit region 1002 and a pad region 1003. A first interconnection layer 110 is arranged on the front surface of the first wafer at the pad region 1003 and the peripheral circuit region 1002. The second wafer 2000 includes second chips arranged in an array. The second chip includes a logic device, and a second interconnection layer connected with the logic device. Reference is made to FIG. 3.

In step S02, a first insulating layer 130 is formed on a back surface of the first wafer at the pad region 1003. Reference is made to FIG. 3.

Figure 7:
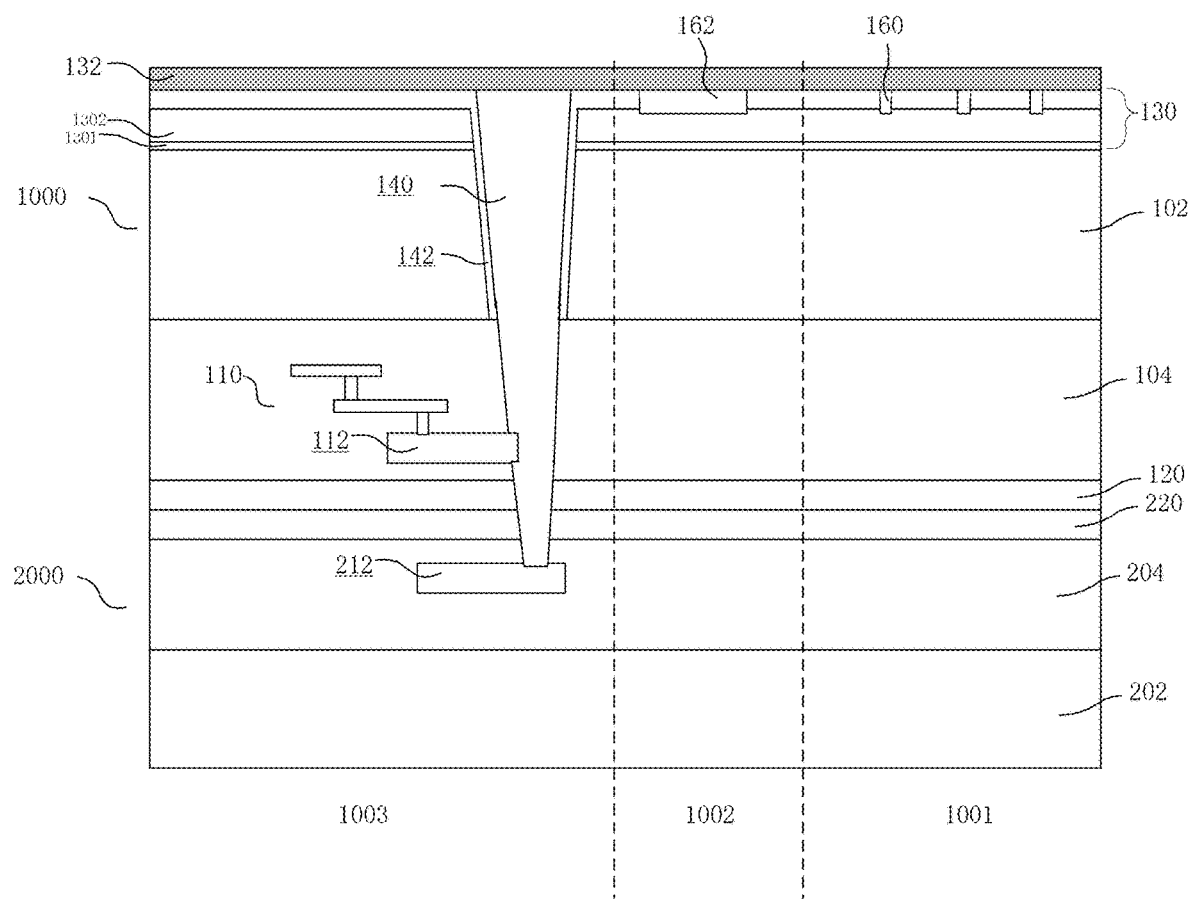

In step S03, a first electrical-connection through-hole 140 is formed at the pad region 1003. The first electrical-connection through-hole 140 runs from the first insulating layer 130, via a top wiring layer 112 in the first interconnection layer, to a top wiring layer 212 in the second interconnection layer. Reference is made to FIG. 7.

Figure 9:
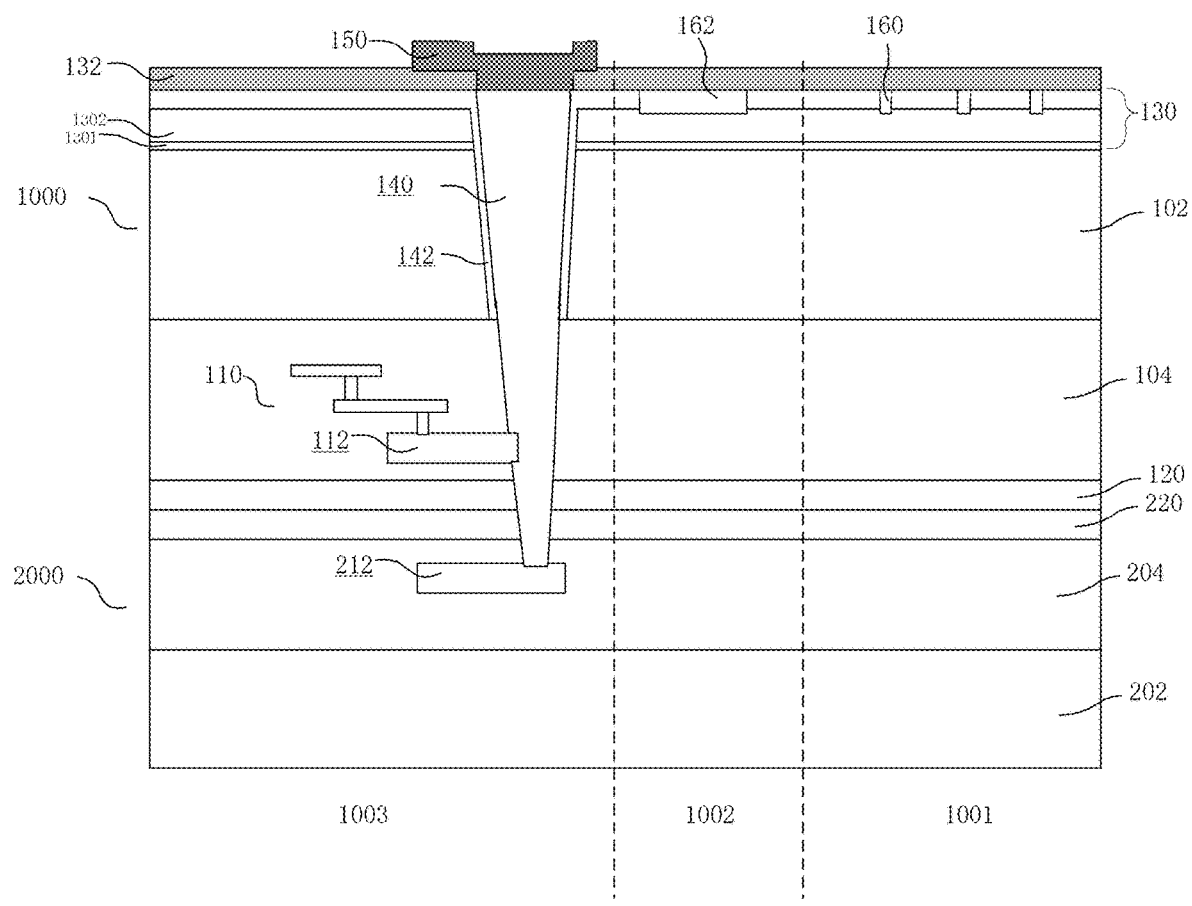
Figure 10:
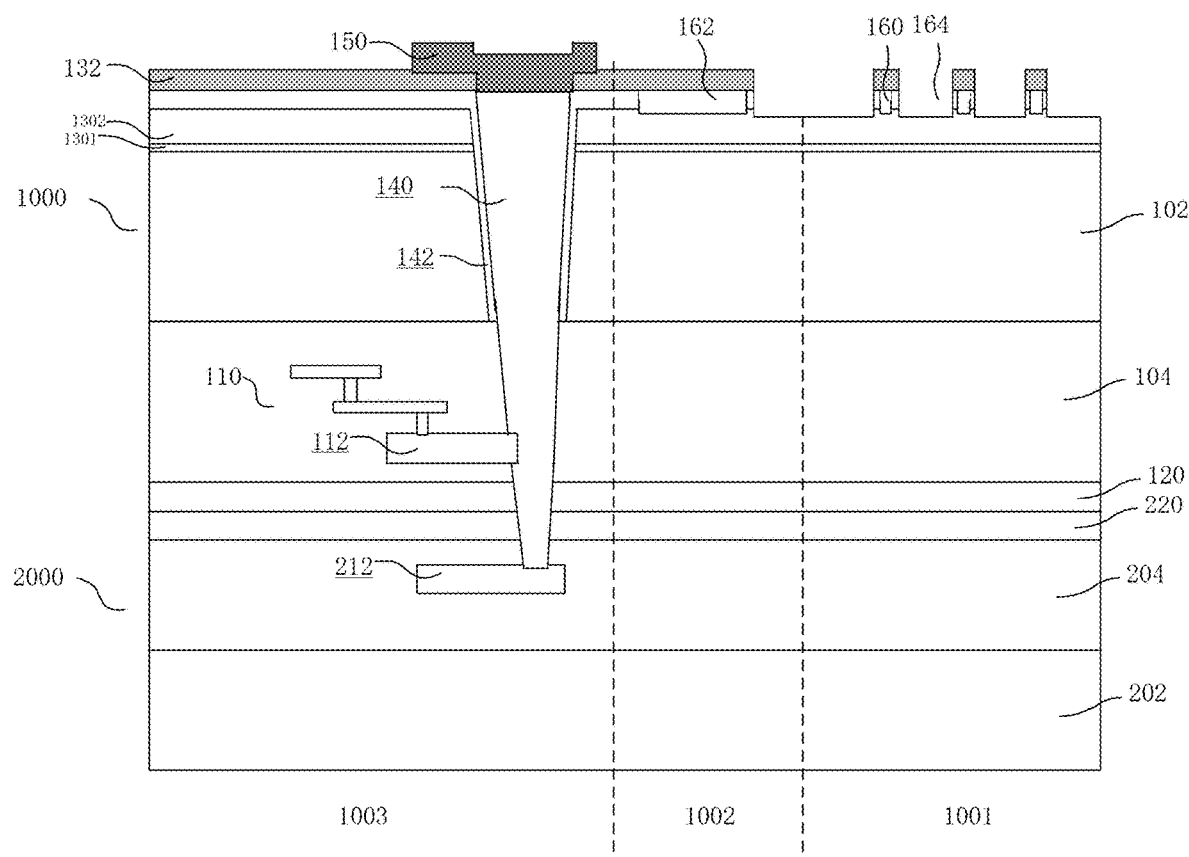

In step S04, a pad 150 is formed on the first electrical-connection through-hole 140. Reference is made to FIG. 9.

Afterwards, the wafer bonding structure may be cut in a cutting process, so as to obtain a bonded chip structure.

In the method, after bonding the first wafer provided with a photosensitive unit chip to the second wafer provided with a logic device, the first insulating layer 130 is formed on the back surface of the first wafer at the pad region, and the first electrical-connection through-hole 140 is formed at the pad region 1003. In one embodiment, the first insulating layer 130 may be formed in multiple steps. Part of the multiple steps may be performed before forming the first electrical-connection through-hole, and other part of the multiple steps may be performed during forming the first electrical-connection through-hole. The first electrical-connection through-hole 140 runs from the first insulating layer 130, via the top wiring layer 112 in the first interconnection layer, to the top wiring layer 212 in the second interconnection layer. Then, the pad 150 is formed on the first electrical-connection through-hole 140. Therefore, a CIS integrated device is formed with a high degree of integration and a simple structure. In one embodiment, the above steps may be performed in different integration processes. Hereinafter embodiments are described in detail in conjunction with the drawings.

Reference is made to FIG. 3. In step S101, a bonded wafer is provided. The bonded wafer includes a first wafer 1000 and a second wafer 2000 that are stacked. A front surface of the first wafer 1000 faces a front surface of the second wafer 2000. A bonding layer 120 and 220 is provided between the front surface of the first wafer 1000 and the front surface of the second wafer 2000. The first wafer 1000 includes first chips arranged in an array. The first chip includes a photosensitive array region 1001, a peripheral circuit region 1002 and a pad region 1003. A first interconnection layer 110 is arranged on the front surface of the first wafer at the pad region 1003 and the peripheral circuit region 1002. The second wafer 2000 includes second chips arranged in an array. The second chip includes a logic device, and a second interconnection layer connected with the logic device.

In one embodiment, device fabrication processes before forming a bonding layer have been performed on the first wafer 1000 and the second wafer 2000. Referring to FIG. 3, a photosensitive array, a device and a first interconnection layer 110 have been formed on a first substrate 102 of the first wafer 1000. The photosensitive array is at the photosensitive array region 1001. The device is at the peripheral circuit region 1002. The first interconnection layer 110 at the peripheral circuit region 1002 and the pad region 1003. The first top wiring layer 112 is an upmost layer of wiring layers in the first interconnection layer 110. The device and the first interconnection layer is covered by a first covering layer 104. A logic device and a second interconnection layer electrically connected with the logic device have been formed on a second substrate 202 of the second wafer 2000. The logic device and the second interconnection layer are covered by a second covering layer 204. The second top wiring layer 212 is an upmost layer of wiring layers in the second interconnection layer.

In one embodiment, after the device fabrication processes being performed on the first wafer 1000 and the second wafer 2000, a first diffusion barrier layer (not shown in the figure) and a first bonding layer 120 may be sequentially deposited on the front surface of the first wafer 1000. In one embodiment, the first diffusion barrier layer may be made of silicon nitride, and the first bonding layer 120 may be made of silicon oxide. A second diffusion barrier layer (not shown in the figure) and a second bonding layer 220 may be sequentially deposited on a front surface of the second wafer 2000. In one embodiment, the second diffusion barrier layer may be made of silicon nitride, and the second bonding layer 220 may be made of silicon oxide. The first substrate and the second substrate may be silicon substrates.

Afterwards, the first bonding layer 120 of the first wafer 1000 faces the second bonding layer 220 of the second wafer 2000, and the two wafers are aligned. Then, the front surface of the first wafer 1000 and the front surface of the second wafer 2000 are bonded by using bonding equipment. A bonding interface of the two wafers is formed between the first bonding layer 120 and the second bonding layer 220 after bonding. The first bonding layer 120 and the second bonding layer 220 form the bonding layer between the first wafer and the second wafer.

After bonding, the first substrate 102 is thinned from the back surface of the first wafer 1000. Multiple processes may be applied in thinning. In one embodiment, a grinding process may be firstly applied for rough grinding, and then a process of chemical mechanical planarization or wet etching may be applied for thinning, until a target thickness is reached.

In step S102, a first insulating layer 130 is formed on a back surface of the first wafer 1000 at the pad region 1003. Reference is made to FIG. 3.

The first insulating layer 130 may be a single layer or a stacked structure, to block diffusion of a metal layer. In one embodiment, the first insulating layer 130 may include a high-k dielectric layer and a silicon oxide layer that are stacked. The first insulating layer 130 is formed by sequentially depositing the high-k dielectric layer and the silicon oxide layer. The high-k dielectric layer may be, for example, a hafnium oxide layer.

In one embodiment, the first insulating layer 130 may be formed through multiple steps. Part of the multiple steps may be performed before forming the first electrical-connection through-hole, and other part of the multiple steps may be performed during forming the first electrical-connection through-hole.

Figure 6:
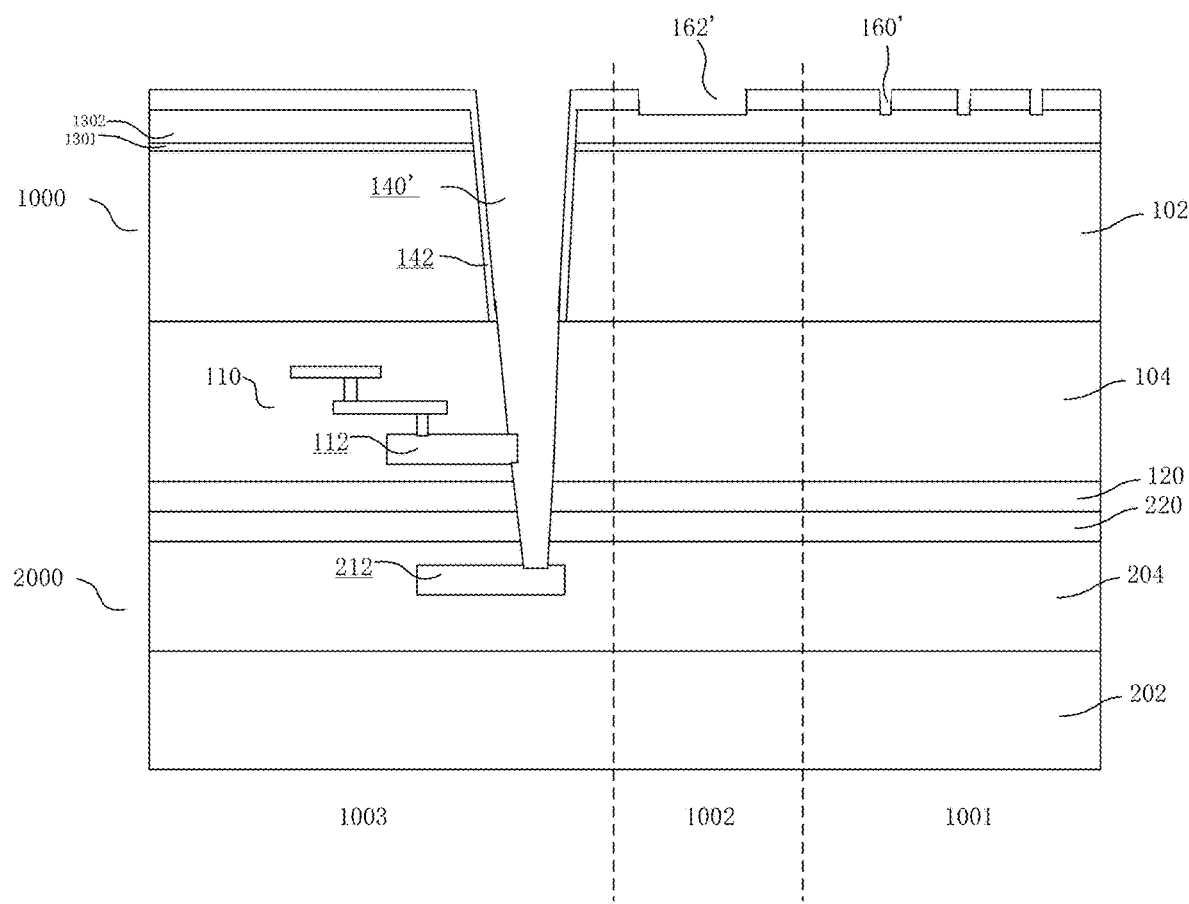

In step S103, a first through-hole 140' is formed at the pad region 1003, and the first through-hole 140' runs from the first insulating layer 130, via a top wiring layer 112 in the first interconnection layer, to a top wiring layer 212 in the second interconnection layer. Further, a to-be-filled opening is formed in the first insulating layer 130 outside the pad region 1003, and the to-be-filled opening does not run through the first insulating layer 130. The to-be-filled opening includes a grating opening 160' located at the photosensitive array region 1001 and/or a shielding opening 162' located at the peripheral circuit region 1002. Reference is made to FIG. 6.

In this step, before filling the first through-hole 140', another opening for filling is formed in the first insulating layer 130 at a region other than the pad region, so as to improve integration degree of a process. In this step, a second through-hole may be further formed at the peripheral circuit region 1002 when forming the first through-hole.

In one embodiment, the step S102 and the step S103 may be implemented based on following steps. Firstly, a high-k dielectric layer 1301 and a first silicon oxide layer 1302 located on the high-k dielectric layer may be sequentially deposited on the back surface of the first substrate 102. Then, a first sub through-hole 1401 is formed, and the first sub through-hole 1401 runs through the first substrate 102 in the first wafer 1000 to the first covering layer 104. The first sub through-hole 1401 may be formed through a process of photolithography and a process of etching, by using a first mask. The first mask is provided a pattern for forming the first sub through-hole. Reference is made to FIG. 3. Afterwards, an insulating layer 142 is formed on a side wall of the first sub through-hole 1401, to protect the side wall and isolate the sidewall from the substrate. The insulating layer 142 may be made of silicon oxide and formed through a process of chemical vapor deposition. The insulating layer 142 is also formed on a bottom surface of the first sub through-hole 1401 and on the first silicon oxide layer 1302. Thereby, the first insulating layer 130 on the back surface of the first substrate 102 includes the high-k dielectric layer 1301, the first silicon oxide layer 1302, and the insulating layer 142 that are sequentially formed from bottom to top.

Figure 4:
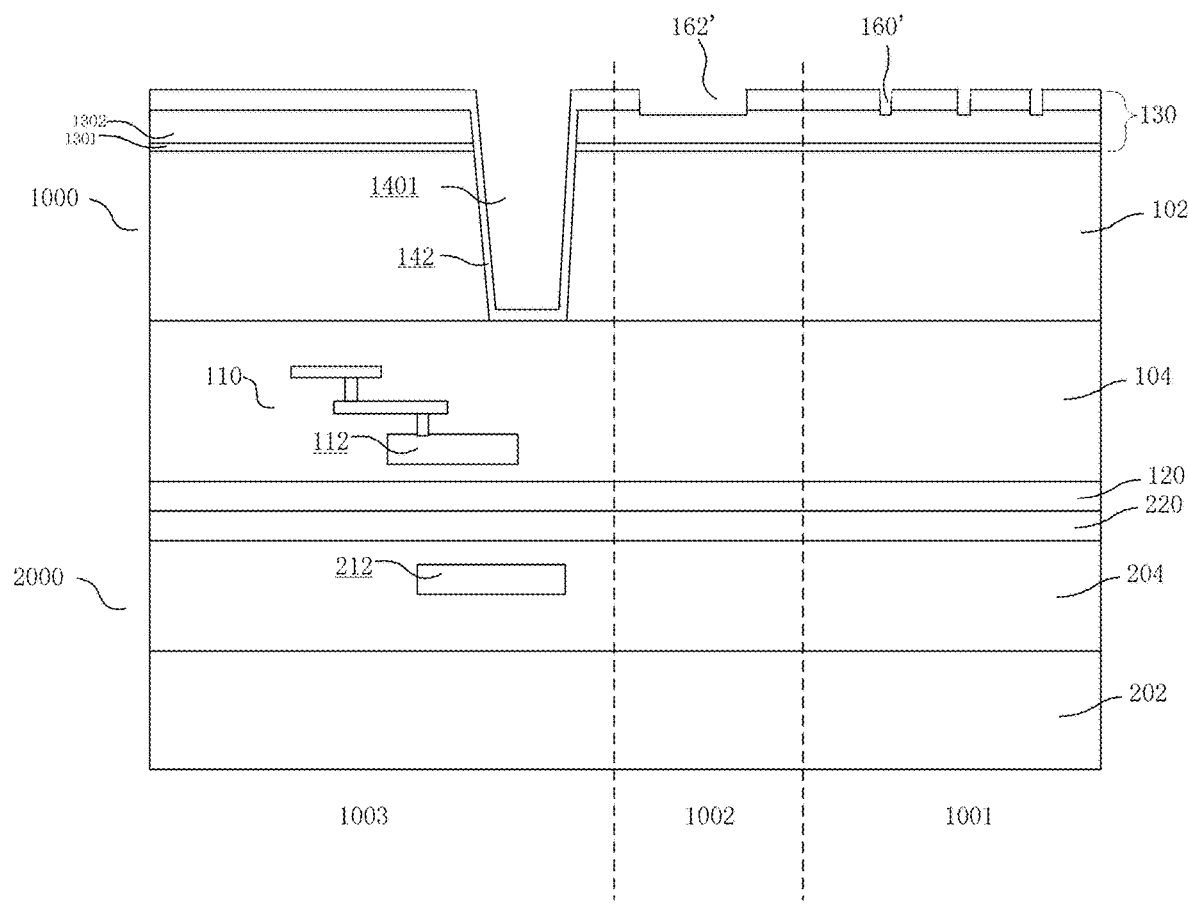

Then, the to-be-filled opening that does not run through first insulating layer 130 is formed outside the pad region 1003. The to-be-filled opening includes the grating opening 160' located at the photosensitive array region 1001 and/or the shielding opening 162' located at the peripheral circuit region 1002. The to-be-filled opening may be formed through a process of photolithography and a process of etching by using a second mask. The second mask is provided with a pattern for forming the to-be-filled opening. Reference is made to FIG. 4.

Figure 5:
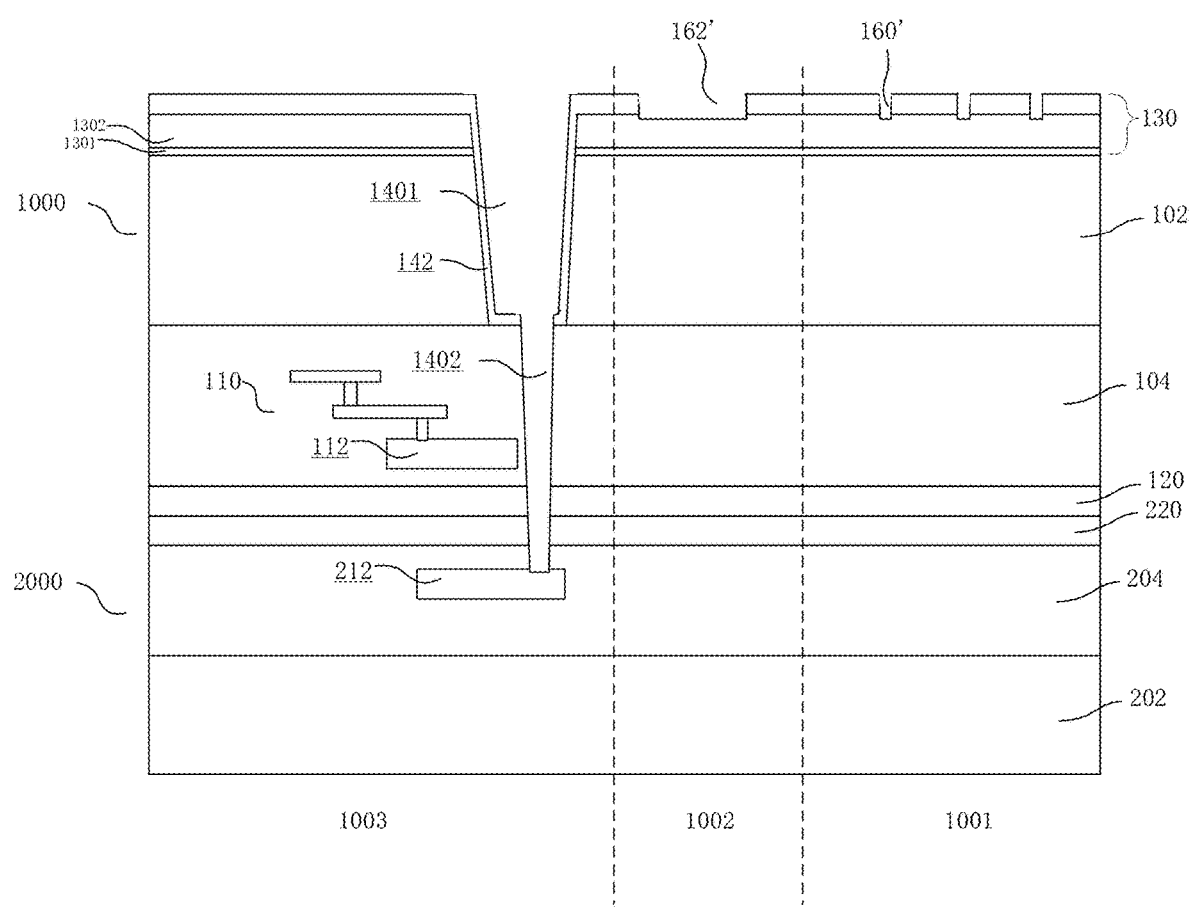

Then, a second sub through-hole 1402 is formed, and the second sub through-hole 1402 runs through the first covering layer 104 to the top wiring layer 212 in the second interconnection layer. The second sub through-hole 1402 runs from the bottom of the first sub through-hole 1401, bypasses the top wiring layer 112 in the first interconnection layer, and extends to the top wiring layer 212 in the second interconnection layer, as shown in FIG. 5. The second sub through-hole 1402 may be formed through a process of photolithography and a process of etching by using a third mask. The third mask is provided with a pattern for forming the second sub through-hole.

Afterwards, the second sub through-hole 1402 is further expanded from the bottom of the first sub through-hole 1401, such that the second sub through-hole 1402 may be connected to the top wiring layer 112 in the first interconnection layer in running to the top wiring layer 212 in the second interconnection layer. The second sub through-hole 1402 that is further expanded may be formed through a process of photolithography and a process of etching by using a fourth mask. The fourth mask is provided with a pattern for expanding the second sub through-hole. Reference is made to FIG. 6. Thereby, the first through-hole 140' that communicating the first interconnection layer and the second interconnection layer is formed.

In step S104, the first through-hole 140' and the to-be-filled opening are filled, to form the first electrical-connection through-hole 140 and a filled opening. The filled opening includes a reflective grating 160 and/or a shielding layer 162. Reference is made to FIG. 7.

In one embodiment, the first electrical-connection through-hole 140, and the reflective grating 160 and/or the shielding layer 162, are made of metal. In one embodiment, the metal may be copper. The filling may be implemented by first depositing copper through electroplating and then planarizing the copper until reaching the first insulating layer 130.

In step S105, a third insulating layer 132 is formed above the filled opening, and a pad 150 is formed on the first electrical-connection through-hole 140.

The third insulating layer 132 is formed on an upper surface of the reflective grating 160 and/or the shielding layer 162, thus the reflective grating 160 and the shielding layer 162 are surrounded by insulating layers. In one embodiment, the pad 150 may be formed after the third insulating layer 132 is formed.

First, the back surface of the first wafer 1000 is further covered by the third insulating layer 132. The third insulating layer 132 may be formed by sequentially depositing a silicon nitride layer and a silicon oxide layer, through a process of chemical vapor deposition.

Figure 8:
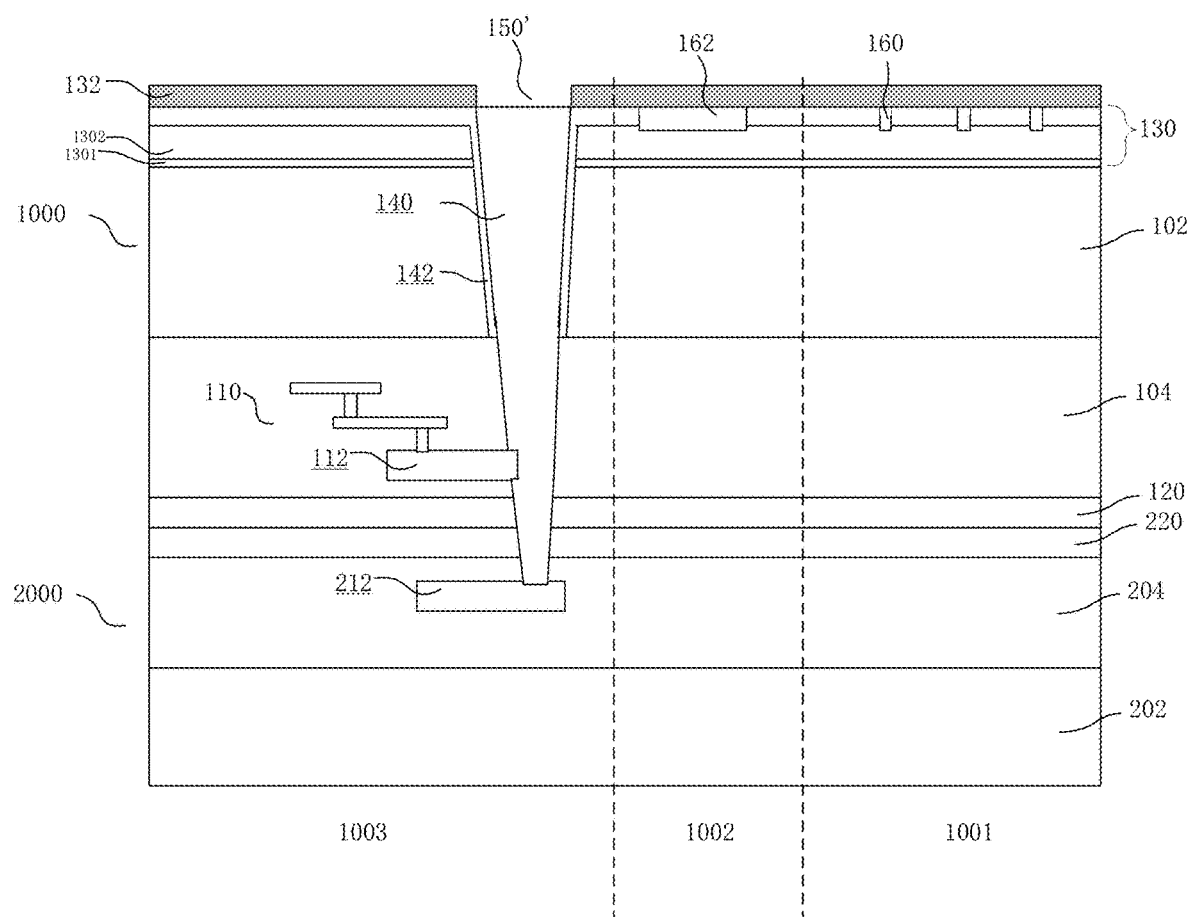

Then, the third insulating layer on the first electrical-connection through-hole 140 is removed. Reference is made to FIG. 8. A pad opening 150' is formed in the third insulating layer 132 above the first electrical-connection through-hole 140, through a process of photolithography and a process of etching by using a fifth mask. The fifth mask is provided with a pattern for removing the third insulating layer above the first electrical-connection through-hole 140.

Then, the pad 150 is formed above the pad opening 150', which is shown in FIG. 9. A material of the pad 150 may be aluminum. An aluminum layer may be deposited through a process of physical vapor deposition. Then, the aluminum layer outside the pad region is removed. The pad 150 may be formed through a process of photolithography and a process of etching by using a sixth mask. The sixth mask is provided with a pattern of a region outside the pad region.

Afterwards, a fillable opening 164 that does not run through the first insulating layer 130 may be formed from the third insulating layer, among the reflective grating 160. The fillable opening 164 may be formed through a process of photolithography and a process of etching by using a seventh mask. The seventh mask is provided with a pattern for forming the fillable opening.

Other manufacturing processes may further be performed afterwards. For example, a BCF may be formed in the fillable opening 164.

The aforementioned wafer structure may be further cut along the cutting trenches, so as to form a chip structure.

In the method according to the aforementioned embodiment, seven masks are used in photolithography to achieve integration on a CIS wafer. A degree of integration is high, and complexity in manufacturing processes is reduced.

The embodiments in this specification are described in a progressive manner. For the same or similar parts between the embodiments, one may refer to the description of other embodiments. Each embodiment lays emphasis on differences from other embodiments. Since the device embodiments are similar to the method embodiments, the description for the device embodiments is relatively simple. For related parts, references may be made to description in the method embodiments.

The above embodiments are preferred embodiments of the present disclosure and are not intended to limit the scope of the present disclosure. It should be understood that, for those skilled in the art, alternations, modifications or equivalent substitutions may be made to the technical solutions of the present disclosure according to the methods and technical solutions above without departing from the scope of the technical solutions of the present disclosure. These alternations, modifications or equivalent substitutions made according to the technical essence of the present disclosure fall within the protection scope of the present disclosure.

The invention claimed is:

1. A chip structure, comprising:
a first chip and a second chip that are stacked, wherein:
a front surface of the first chip faces a front surface of the second chip;
a bonding layer is provided between the front surface of the first chip and the front surface of the second chip;
the first chip comprises a photosensitive array region, a peripheral circuit region and a pad region;
a first interconnection layer is formed on the front surface of the first chip at the pad region and the peripheral circuit region;
the second chip comprises a logic device, and a second interconnection layer connected with the logic device;
a first insulating layer, covering a back surface of the first chip at the pad region;
a first electrical-connection through-hole located at the pad region, running from the first insulating layer, via a top wiring layer in the first interconnection layer at the pad region, to a top wiring layer in the second interconnection layer;
a pad located on the first electrical-connection through-hole;
a second insulating layer, covering the back surface of the first chip at the photosensitive array region; and a reflective grating, located in the second insulating layer at the photosensitive array region, wherein:
the reflective grating is arranged in correspondence to a peripheral region of a photosensitive unit;
a fillable opening is provided among the reflective grating; and
a part of the second insulating layer is located under the fillable opening and the reflective grating.

2. The chip structure according to claim 1, wherein:
the second insulating layer further covers the back surface of the first chip at the peripheral circuit region, and
the chip structure further comprises:
a shielding layer located in the second insulating layer at the peripheral circuit region, wherein another part of the second insulating layer are located under the shielding layer.

3. The chip structure according to claim 2, wherein the second insulating layer and the first insulating layer are identical in structure and in composition.

4. The chip structure according to claim 3, wherein the reflective grating, the shielding layer, and the first electrical-connection through-hole comprise a same metal material.

5. The chip structure according to claim 2, further comprising:
a third insulating layer located above the first insulating layer and the second insulating layer, wherein:
the third insulating layer covers the shielding layer and the reflective grating, and a part of the pad is located on the third insulating layer at the pad region.

6. The chip structure according to claim 1, further comprising:
a second electrical-connection through-hole located at the peripheral circuit region, running from the first insulating layer, via a top wiring layer in the first interconnection layer at the peripheral circuit region, to the top wiring layer in the second interconnection layer.

7. A wafer structure, comprising a wafer bonding structure, wherein the wafer bonding structure comprises an array of the chip structures according to claim 1.

8. A method for manufacturing a wafer structure, comprising:
providing a bonded wafer, wherein:
the bonded wafer comprises a first wafer and a second wafer that are stacked;
a front surface of the first wafer faces a front surface of the second wafer;
a bonding layer is provided between the front surface of the first wafer and the front surface of the second wafer;
the first wafer comprises first chips arranged in an array;
each of the first chips comprises a photosensitive array region, a peripheral circuit region and a pad region;
a first interconnection layer is arranged on the front surface of the first wafer at the pad region and at the peripheral circuit region;
the second wafer comprises second chips arranged in an array; and
each of the second chips comprises a logic device and a second interconnection layer connected with the logic device;
forming a first insulating layer on a back surface of the first wafer at the pad region;
forming a first electrical-connection through-hole at the pad region, wherein the first electrical-connection through-hole runs from the first insulating layer, via a top wiring layer in the first interconnection layer at the pad region, to a top wiring layer in the second interconnection layer; and
forming a pad on the first electrical-connection through-hole;
wherein the first insulating layer is further formed on the back surface of the first wafer at the photosensitive array region; and
wherein the method further comprises:
forming a reflective grating that is located in the first insulating layer at the photosensitive array region, wherein the reflective grating is arranged in correspondence to a peripheral region of a photosensitive unit, a fillable opening is provided among the reflective grating, and a part of the first insulating layer is located under the fillable opening and the reflective grating.

9. The method according to claim 8,
wherein forming the first electrical-connection through-hole at the pad region comprises:
forming a first through-hole running from the first insulating layer, via the top wiring layer in the first interconnection layer at the pad region, to the top wiring layer in the second interconnection layer; and
filling the first through-hole to form the first electrical-connection through-hole; and
wherein forming the reflective grating that is located in the first insulating layer at the photosensitive array region comprises:
forming a to-be-filled opening in the first insulating layer at the region out of the pad region, wherein a depth of the to-be-filled opening is smaller than a thickness of the first insulting layer, and the to-be-filled opening comprises a grating opening located at the photosensitive array region;
filling the to-be-filled opening to form a filled opening, wherein the filled opening comprises the reflective grating formed by filling the grating opening; and
forming a third insulating layer above the filled opening.

10. The method according to claim 9, wherein forming the third insulating layer above the filled opening comprises:
forming the third insulating layer that covers the back surface of the first wafer; and
removing the third insulating layer that is above the first electrical-connection through-hole, before forming the pad on the first electrical-connection through-hole.

11. The method according to claim 9, further comprising:
forming the fillable opening among the reflective grating, wherein the fillable opening runs from the third insulating layer, and the first insulating layer remains at a bottom and a sidewall of the fillable opening.

12. The method according to claim 8, further comprising:
cutting the bonding wafer, to obtain an independent chip structure.

13. The method according to claim 9, wherein the first insulating layer is further formed on the back surface of the first wafer at the peripheral circuit region, and wherein the to-be-filled opening further comprises a shielding opening located at the peripheral circuit region, and the filled opening further comprises a shielding layer formed by filling the shielding opening.

* * * * *